United States Patent [19]
Nix et al.

[11] Patent Number: 5,193,911
[45] Date of Patent: Mar. 16, 1993

[54] THERMAL DETECTOR DEVICE

[75] Inventors: Elvin L. Nix, Windsor; Brian Holcroft, High Wycombe; Stephen D. Etienne, Hayes, all of England

[73] Assignee: Thorn Emi plc, London, England

[21] Appl. No.: 690,714

[22] Filed: Apr. 24, 1991

[30] Foreign Application Priority Data

Apr. 24, 1990 [GB] United Kingdom ............... 9009117

[51] Int. Cl.⁵ .................... G01J 5/12; H01L 27/16
[52] U.S. Cl. .................... 374/121; 374/178; 358/113; 437/3; 250/338.3; 257/467
[58] Field of Search ............ 374/110, 121, 124, 163, 374/166, 178; 357/28; 358/113; 250/330, 338.3; 29/25.01; 437/3; 136/213

[56] References Cited

U.S. PATENT DOCUMENTS

| | | | |
|---|---|---|---|
| 4,047,436 | 9/1977 | Bernard et al. | 374/178 X |
| 4,072,863 | 2/1978 | Roundy | 358/113 X |
| 4,126,496 | 11/1978 | Verderber | 357/28 X |
| 4,142,206 | 2/1979 | Ennulat | 358/113 |
| 4,348,611 | 9/1982 | Ruppel et al. | 358/113 X |
| 4,740,700 | 4/1988 | Shaham et al. | 437/3 X |
| 4,902,648 | 2/1990 | Ohta et al. | 357/28 X |

FOREIGN PATENT DOCUMENTS

| | | |
|---|---|---|
| 0345049 | 12/1989 | European Pat. Off. |
| 0375205 | 6/1990 | European Pat. Off. |
| 56618 | 1/1981 | Japan ........... 374/124 |

Primary Examiner—William A. Cuchlinski, Jr.
Assistant Examiner—G. Bradley Bennett
Attorney, Agent, or Firm—Keck, Mahin & Cate

[57] ABSTRACT

A thermal imaging device comprising a pyroelectric layer having on one major surface an array of interconnected electrodes forming an entrance face, and on the opposite major surface an array of discrete electrodes connected to electrical circuitry formed on a semiconductive substrate. Between the entrance faces of individual detector elements in a network of further electrodes of high thermal conductance which provides a high degree of thermal isolation for the detector elements and prevents significant thermal cross-talk between adjacent detector elements.

20 Claims, 4 Drawing Sheets

THERMAL DETECTOR DEVICE

The present invention relates to a thermal detection device and also to a method of fabricating such a device. The invention has particular, though not exclusive relevance to a thermal imaging device as incorporates an organic pyroelectric material.

It is known that in circumstances where it is desired to fabricate a thermal detector device comprising an array of closely spaced pyroelectric detectors coupled to electrical circuit components disposed adjacent the array, there is often a conflict between the requirements of thermal and electrical performance of the array.

In order to provide adequate electrical performance, it is advantageous that the individual detector elements of the array be as large as possible, subject to the constraints of the overall dimensions available, especially when it is appreciated that arrays comprising 100×100 individual detector elements may now be fabricated in, for example, an area of 10 mm×10 mm. However, such a compact arrangement tends to produce adverse effects such as thermal cross-talk between neighbouring detector elements, thermal conduction along electrical conductors, thermal conduction to heat sinks and variable resistance in electrical paths to ground.

It is desirable that the above effects do not interfere with, or otherwise mask, electrical signals generated within the array. This would tend to corrupt a thermal profile of a scene to which the array is exposed.

It is thus an object of the present invention to provide a thermal detector device including a pyroelectric detector array in which the above adverse effects are at least alleviated.

It is a further object of the present invention to provide a method by which such a device may be fabricated.

Hence, according to a first aspect of the present invention there is provided a thermal imaging device comprising: a pyroelectric layer having an array of interconnected electrodes on one major surface of said layer and an array of discrete electrodes as an opposite major surface of said layer, thereby to form an array of pyroelectric detector elements; an electrical signal processing means; a plurality of pillars for supporting said layer and for enabling the passage of electrical signals between the detector elements and said signal processing means; and a network of thermally conductive further electrodes interspersed between the detector elements and formed on said one major surface of said layer for reducing thermal cross-talk between adjacent detector elements.

Thus by providing the array of detector elements with a network of thermally conducting further electrodes in between the individual detector elements, this allows neighbouring detector elements a high degree of thermal isolation, because unwanted heat will generally be conducted away via the further electrodes.

Preferably the further electrodes are arranged to comprise an interconnecting mesh. This structure permits the interconnecting mesh-points to be close to the heat-sink temperature thus providing a point whereby heat conducted via the further electrodes may be removed from the vicinity of the individual detector elements.

Additionally, the pillars may comprise electrically and thermally conductive material. Hence, as well as providing an electrical communication route between the detector elements and the electrical signal processing means, the pillars provides each mesh-point with a thermal conduction path.

According to a second aspect of the present invention there is provided a method of manufacturing a thermal detector device comprising an array of pyroelectric detector elements, the method comprising:

(a) providing a semiconductive substrate bearing electrical circuitry for receiving and processing electrical signals generated by the detector elements;

(b) depositing a sacrificial material to form a layer on the substrate;

(c) creating apertures through the layer in desired spatial relationship with the circuitry and depositing at least partially electrically conductive material in the apertures to establish electrical connection with the circuitry;

(d) forming an array of discrete electrodes on the surface of the layer, each electrode establishing an electrical contact with one of the electrical connections and thence to the circuitry;

(e) depositing a layer of pyroelectric material on top of the array of discrete electrodes;

(f) depositing a layer of electrode material on top of the pyroelectric material;

(g) configuring the layer of electrode material and the layer of pyroelectric material to create an array of pyroelectric element components each overlying a respective discrete electrode of the array, and each being linked to a lattice arrangement of support members, crossing members of which overlie respectively the electrical connections;

(h) depositing thermally conductive further electrodes on at least some of the support members;

(i) removing, at any convenient stage, the sacrificial material.

The invention will now be described, by way of example only, with reference to the following drawings of which:

Figure 1:
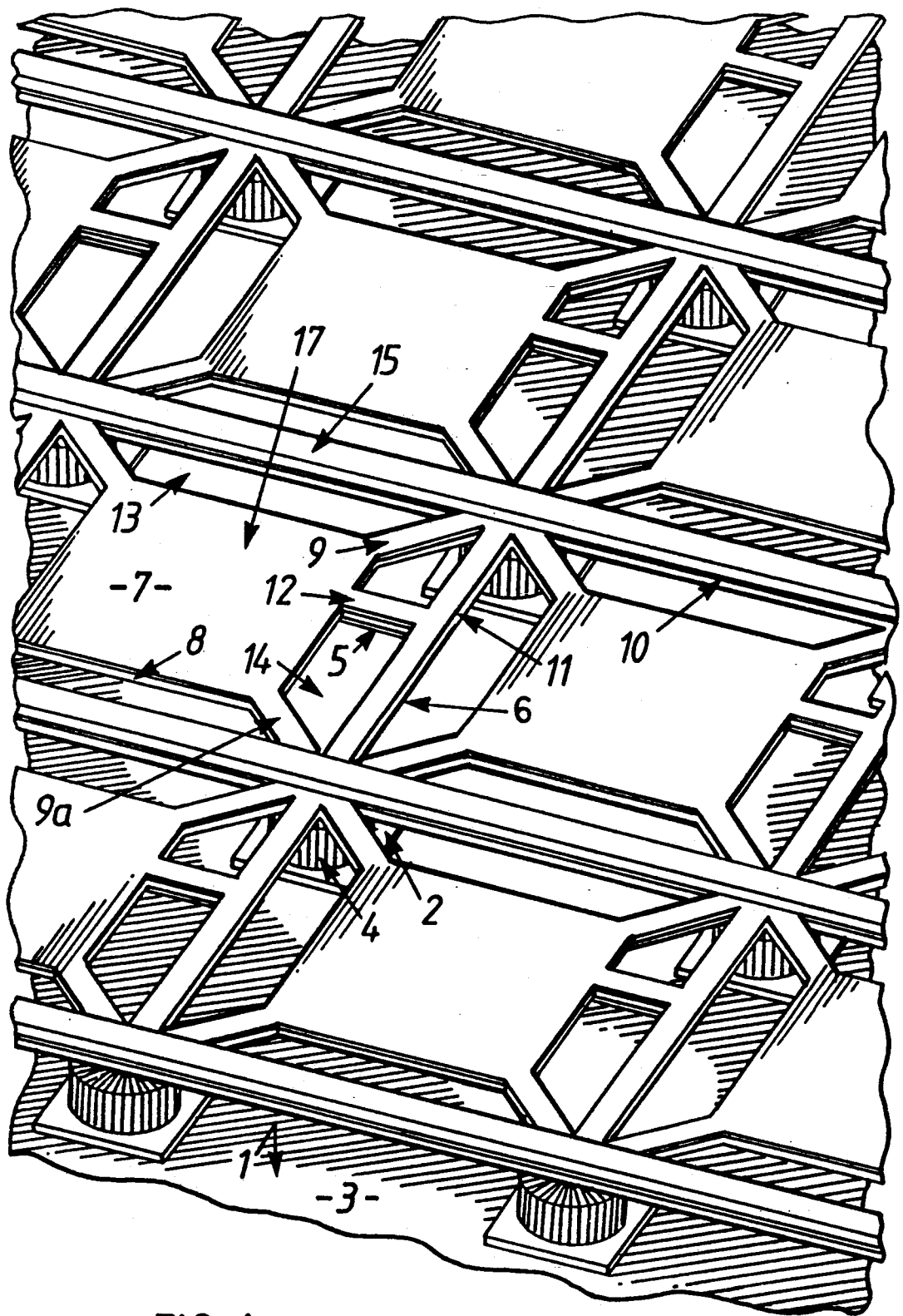
FIG. 1 shows schematically a perspective view of part of a detector device in accordance with the present invention.
Figure 2:
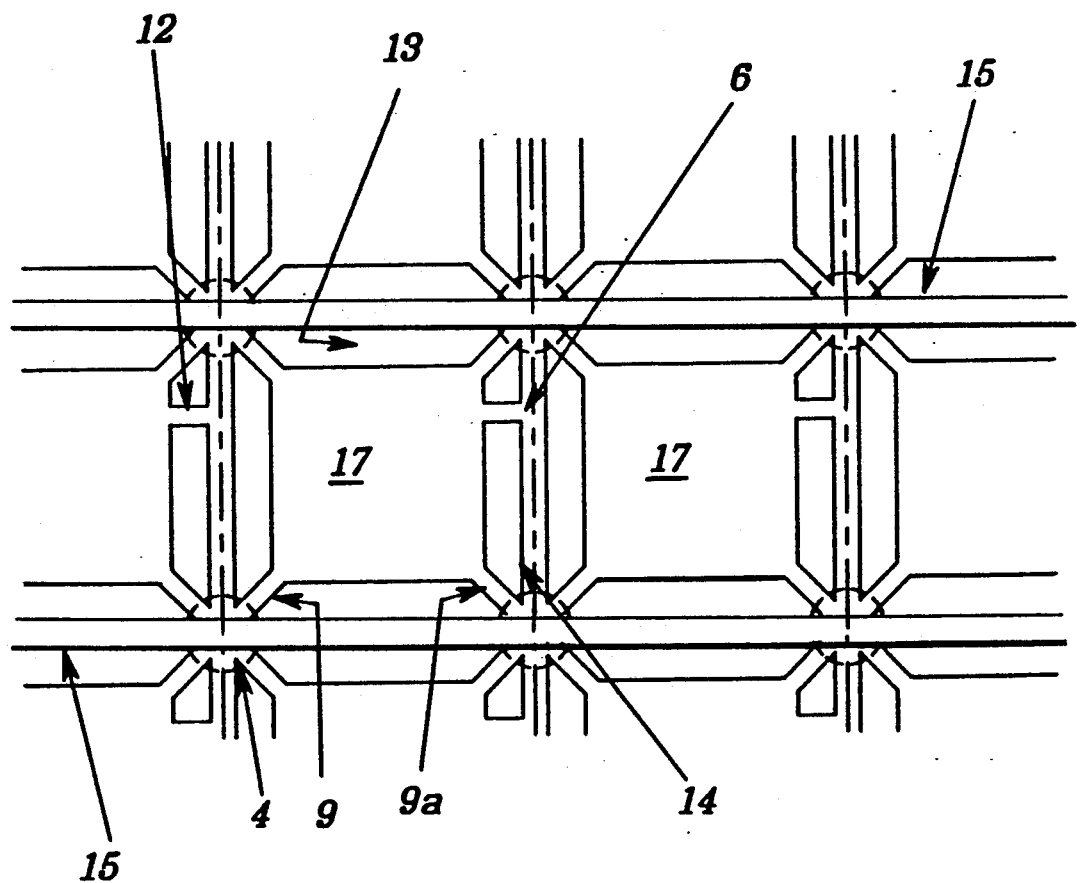
FIG. 2 shows a schematic plan view of the device of FIG. 1.

A thermal detector, as shown in FIGS. 1 and 2, is preferably formed by planar fabrication techniques, partly in order to avoid the disadvantages of hybrid fabrication as envisaged, for example, in UK Patent Application No. 2163596. It will be appreciated, however, that the principles of the invention apply also to detectors fabricated by hybrid techniques, and that the present invention is not limited in its application to planar fabrication techniques.

Referring now to FIGS. 1 and 2, a substrate 1 of semiconductive material is formed in a known manner with a plurality of electrical circuit components 2. The substrate 1 is capable of receiving and processing electrical signals derived from a planar array of, for example 100×100 detector elements.

Substrate 1 has a substantially planar upper surface 3, on to which is deposited a layer (not shown) of sacrificial material, for example, copper. Apertures are formed through the copper layer, utilising well-known processing techniques to each of the circuit components 2 and the apertures are then filled with a material of high electrical and thermal conductivity, such as gold, to restore a substantially flat upper surface to the layer.

The gold filling within the apertures creates electrically and thermally conductive pillars 4 which are initially surrounded by the copper sacrificial layer but eventually, as illustrated in FIG. 1, stand alone following the removal of the copper sacrificial layer which occurs at a later stage.

An array of planar electrodes of highly electrically conductive ($<10\Omega$ per square) material, such as gold, is next deposited in a required pattern on the substantially even surface presented by the copper sacrificial layer with the gold pillars 4 incorporated in the apertures.

Each electrode in the array includes an electrically conductive path via first 5 and second 6 orthogonal gold links to a respective one of the pillars 4, thereby to establish electrical contact with its respective electrical circuitry 2 on substrate 1. Thermal conduction along links 5 and 6 is kept within tolerable limits by suitable dimensioning of the thickness, width and length of the links 5, 6. Materials other than gold may be employed for forming links 5 and 6 such as titanium. It will be apparent to those skilled in the art that such thermal drain that does exist along links 5, 6 will be substantially the same for all electrodes in the array.

In the next stage of the process a continuous film 8 of pyroelectric material is deposited over the entire array of electrodes. The film may include material to provide physical support thereto. Once deposited, the pyroelectric material will be subsequently shaped, by etching or other suitable technique, to conform to a predetermined pattern substantially matching that of the planar electrodes.

Above the film 8 of pyroelectric material there is deposited a metallic layer which is intended to form the entrance electrodes in the finished array of pyroelectric detector elements. The metallic material in this case does not need to be of very high electrical conductivity, and nichrome (resistivity $\approx 377\Omega$ per square) has been found to be suitable. Both the nichrome layer and film 8 of pyroelectric material are next treated so as to form an array of discrete elements 17, each consisting of an entrance electrode 7 of nichrome and a pyroelectric element 8, both of which overlie a gold electrode (which cannot be seen) which is connected via links 5 and 6 and a gold pillar 4 to its respective electrical circuit component 2 on substrate 1.

As previously mentioned, entrance electrode 7 and pyroelectric film 8 of each detector element are substantially identical in form and overlie a respective lower gold electrode which is very similarly shaped.

In practice, the lower electrodes, which cannot be seen in the FIGS. 1 and 2, are slightly smaller in area than the corresponding entrance electrode 7 and pyroelectric film 8 in order to reduce the risk of a short circuit occurring between the two electrodes across the edge of the pyroelectric film 8 during the processing stages. This may result if the edges of the two electrodes were in precise alignment.

It will be seen from the drawings that each discrete element 17, having an associated entrance (radiation receiving) electrode 7 and pyroelectric film 8, is formed with four diagonal supporting arms 9. The layers used to form the entrance electrode 7 and pyroelectric film 8 are, however, left in place in areas such as 10 and 11 thereby to provide a lattice of interconnecting "row" and "column" ribs. Regions 12 are also left in place which overlie the conductive links 5 to the lower electrodes. It will also be seen from FIG. 1 that conductive links 6 also underlie parts of the columnar ribs 11.

Apertures 13, 14 formed between each discrete element 17 and the supporting row and column ribs 10, 11 surrounding it are significant in controlling thermal cross-talk between neighbouring elements. Apertures 13, 14 are also utilised for providing access for a suitable etchant to the copper sacrificial layer, in order that the layer and the copper sacrificial material may be removed.

Removal of the copper layer leaves each discrete element 17 comprising an entrance electrode 7, pyroelectric film 8 and the underlying gold electrode coupled via conductive links 5 and 6 to its respective gold pillar 4, suspended by diagonal supporting arms 9 above the semiconductive substrate 1, and also supported by the row and column ribs 10, 11 of the aforementioned lattice which in turn are support by the gold pillars 4.

The construction described herebefore exhibits good performance as regards thermal cross-talk between discrete elements 17, and as regards thermal leakage from each discrete element 17 to the semiconductive substrate 1, and also as regards electrical connection to the substrate 1 via gold pillars 4.

However, it has been found that further improvement as regards the above may be made by the inclusion of thermally conductive further electrodes 15 interspersed between the discrete elements 17. The further electrodes are chosen to be formed from electrically and thermally conductive material such as gold, and provide an electrical connection to "ground" potential and a thermal connection to a "heat-sink" for each of the discrete elements 17, thus providing further improvement regarding thermal cross-talk and thereby providing enhanced picture quality in the thermal imaging device.

The further electrodes 15 are deposited on each of the row ribs 10 thereby forming a network throughout the array of discrete elements 17. Because of their good thermal conductance, the network of further electrodes 15 provide a high degree of thermal isolation as between each discrete element 17 and its adjacent neighbouring electrodes.

It will be seen that further electrodes 15 overlie gold pillars 4 between each discrete element 17. This "crossover" provides a mesh-point for each discrete element 17 which is close to the heat-sink temperature. This enables the network of further electrodes 15 to remain substantially at the heat-sink temperature, as any excess heat will be conducted away via further electrodes 15 and gold pillars 4.

It will be understood that since the further electrodes 15 are electrically, as well as thermally, conductive then this provides for each discrete element 17 to have an associated mesh-point substantially at ground potential. Thus each discrete element 17 has a low electrical resistance route to ground and hence good electrical connection may be made from each adjacent gold further electrode 15 to each entrance electrode 7 without adding an excessive thermal burden to the array.

Figure 3A:
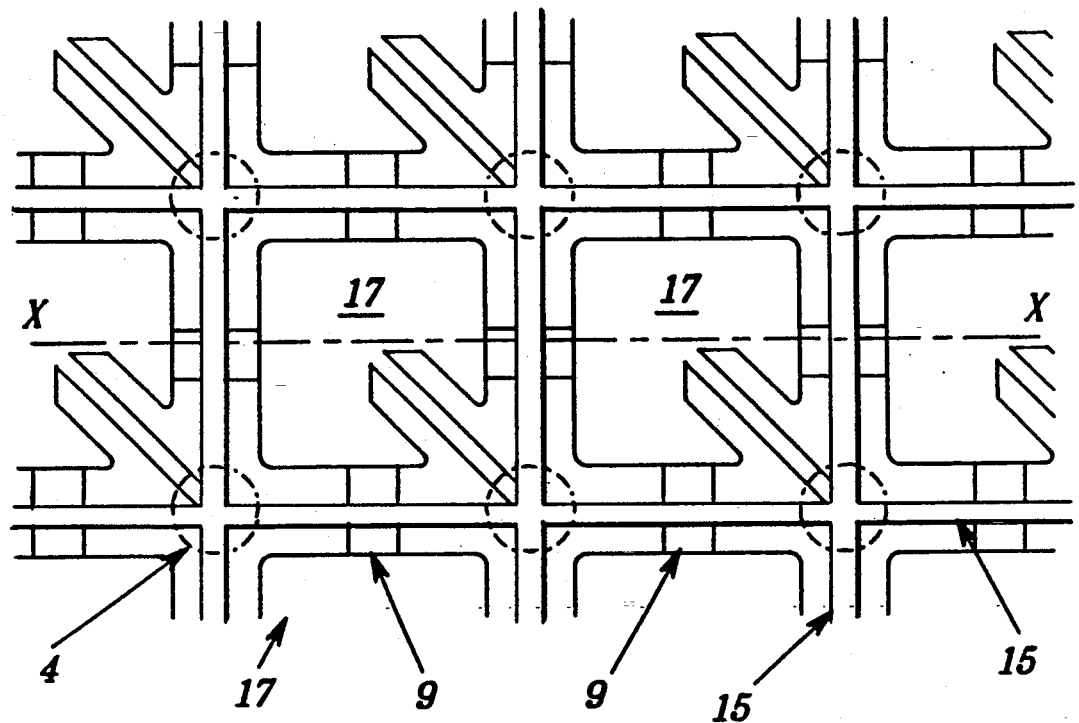
FIGS. 3a and 3b show a schematic plan view and a schematic cross-sectional view of an alternative structure to the device of FIGS. 1 and 2.
Figure 3B:
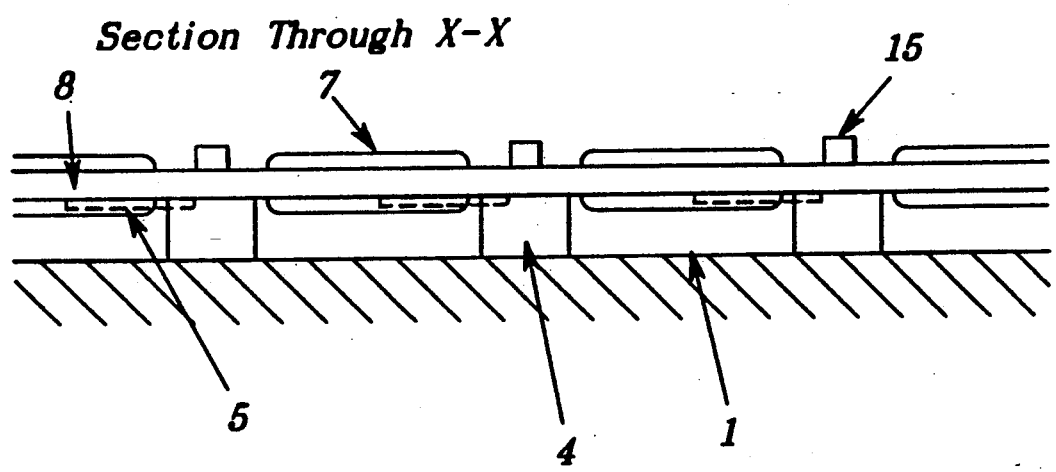
Figure 4:
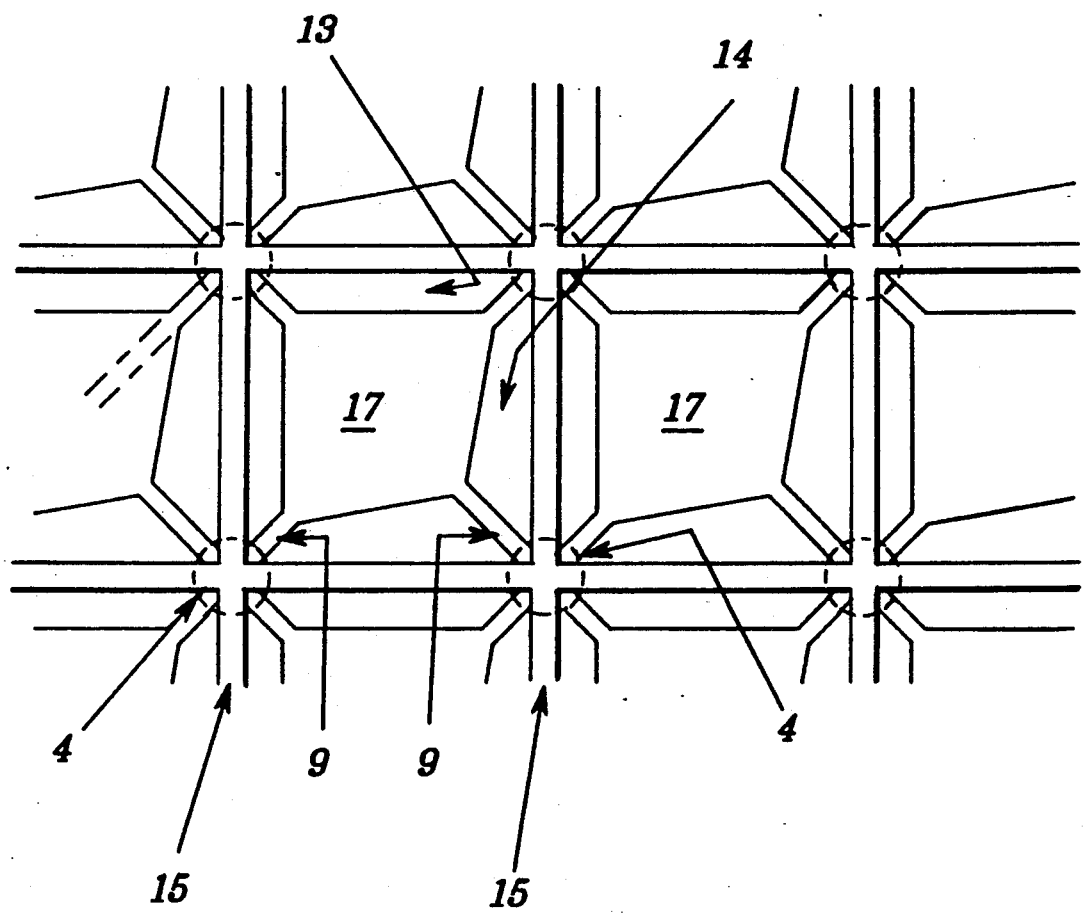
FIG. 4 shows yet another alternative structure of a device in accordance with the present invention. In all the drawings, like components are numbered likewise.

If required, the columnar ribs 11 of the lattice configuration may also support the further electrodes 15, thereby to provide a mesh network such as is shown in FIGS. 3 and 4. However, an advantage of the arrangement shown in FIGS. 1 and 2 is that the risk of short circuits from the further electrodes 15 to the semiconductive substrate 1 are reduced since there is no direct superimposition of such further electrodes 15 with conductive links 6. Furthermore, if the further electrodes 15 are also provided on columnar ribs 11, there will be a reduction in thermal isolation of links 5, 6 and in these circumstances, it becomes desirable to make the connections from the gold electrodes to the gold pillars 4 along a track formed beneath an appropriate diagonal supporting arm 9a and to remove conductive link 5 underlying region 12.

At points where the further electrodes 15 overlie the connection of links 6 with respective gold pillars 4, the existence of the star or asterisk-shaped configuration, including supporting limbs 9, renders short circuits improbable. By referring once again to FIGS. 3 and 4 it will be seen how alternative constructions of discrete elements 17 may be arranged within the array. FIG. 3 illustrates an embodiment in which the diagonal supporting arms 9 of FIGS. 1 and 2 are replaced by supporting arms 9 which are substantially orthogonal to the edge faces of the discrete elements 17. Electrical connection to the electrical circuitry 2 carried on substrate 1 is by way of diagonally disposed resistive metallic links 19 on opposite sides of pyroelectric film 8.

FIG. 4 illustrates yet another alternative array construction. The discrete element 17 comprising the pyroelectric film 8 is supported at its four corners by supporting arms 9. Three of the supporting arms 9 consist of the pyroelectric film 8 having a resistive nichrome coating on the "entrance" surface. The fourth arm 9 has, in addition to the upper nichrome coating, a lower gold coating which provides electrical connection to the electrical circuitry 2 carried on substrate 1.

The detector array described hereinbefore is formed by planar fabrication techniques, partly to avoid the disadvantages of hybrid fabrication as envisaged, for example, in UK Patent number 2163596. Those skilled in the art will, however, appreciate that the principles of the invention also apply to thermal detector arrays fabricated by hybrid techniques, and that the present invention is not limited in its application to planar fabrication techniques.

Furthermore, in the above examples, the output electrical signal from each discrete element 17 is intended to be applied to a respective electrical circuitry component 2, although time multiplexing of circuit components may equally well be utilised.

In an alternative configuration to that described above, whilst still remaining within the scope of the invention, the stage in which the apertures are filled with an electrically conductive material, such as gold, is omitted. The upper surface of the copper sacrificial material layer will then be substantially even, with apertures extending down to the electrical circuitry 2.

An array of planar electrodes is deposited, using material such as gold or titanium, in a predetermined pattern in such a manner that the electrodes lie on the substantially even surface of the copper sacrificial material, and extend down along the walls of the aperture in order to make electrical connection with the underlying electrical circuitry 2. All subsequent development stages are as hereinbefore described.

It will be apparent to those skilled in the art that alternatives to the above description may be employed whilst still remaining within the scope of the invention.

We claim:

1. A thermal imaging device comprising: a pyroelectric layer having an array of interconnected electrodes on one major surface of said layer and an array of discrete electrodes on an opposite major surface of said layer, thereby to form an array of pyroelectric detector elements; an electrical signal processing means; a plurality of pillars for supporting said layer and for enabling the passage of electrical signals between the discrete electrodes and said signal processing means; and a network of thermally conductive further electrodes interspersed between the detector elements and formed on said one major surface of said layer for reducing thermal cross-talk between adjacent detector elements.

2. A device according to claim 1 wherein the further electrodes are arranged to comprise an interconnecting mesh.

3. A device according to claim 1 wherein the pillars comprise electrically and thermally conductive material.

4. A device according to claim 1 wherein the pillars are arranged for maintaining the array of pyroelectric detector elements at a predetermined heat-sink temperature.

5. A device according to claim 4 wherein the further electrodes, in part at least, are in thermal co-operation with the pillars thereby to provide a mesh point substantially at said predetermined heat-sink temperature.

6. A device according to claim 1 wherein the further electrodes are arranged to provide each of the array of pyroelectric detector elements with a mesh point at ground potential.

7. A device according to claim 2 wherein the further electrodes are arranged to provide each of the array of pyroelectric detector elements with a mesh point at ground potential.

8. A device according to claim 3 wherein the further electrodes are arranged to provide each of the array of pyroelectric detector elements with a mesh point at ground potential.

9. A device according to claim 4 wherein the further electrodes are arranged to provide each of the array of pyroelectric detector elements with a mesh point at ground potential.

10. A device according to claim 1 wherein the further electrodes and the pillars comprise metallic material.

11. A device according to claim 2 wherein the further electrodes and the pillars comprise metallic material.

12. A device according to claim 3 wherein the further electrodes and the pillars comprise metallic material.

13. A device according to claim 4 wherein the further electrodes and the pillars comprise metallic material.

14. A device according to claim 6 wherein the further electrodes and the pillars comprise metallic material.

15. A device according to claim 7 wherein the further electrodes and the pillars comprise metallic material.

16. A device according to claim 8 wherein the further electrodes and the pillars comprise metallic material.

17. A device according to claim 9 wherein the further electrodes and the pillars comprise metallic material.

18. A device according to claim 10 wherein the metallic material consists of gold.

19. A method of manufacturing a thermal detector device comprising an array of pyroelectric detector elements, the method comprising:

(a) providing a semiconductive substrate bearing electrical circuitry for receiving and processing electrical signals generated by the detector elements;

(b) depositing a sacrificial material to form a layer on the substrate;

(c) creating apertures through the layer in desired spatial relationship with the circuitry and depositing at least partially electrically conductive material in the apertures to establish electrical connection with the circuitry;

(d) depositing an array of discrete electrodes on the surface of the layer, each electrode establishing an electrical contact with one of the electrical connections and thence to the circuitry;

(e) depositing a layer of pyroelectric material on top of the array of discrete electrodes;

(f) depositing a layer of electrode material on top of the pyroelectric material;

(g) configuring the layer of electrode material and the layer of pyroelectric material to create an array of pyroelectric element components each overlying a respective discrete electrode of the array, and each being linked to a lattice arrangement of support members, crossing members of which overlie respectively the electrical connections;

(h) depositing thermally conductive further electrodes on at least some of the support members;

(i) removing, at any convenient stage, the sacrificial material.

20. A method according to claim 19 wherein the sacrificial material consists of copper.

* * * * *